June 3, 1958 C. D. THURMOND 2,837,448

METHOD OF FABRICATING SEMICONDUCTOR PN JUNCTIONS

Filed Oct. 26, 1953 2 Sheets-Sheet 1

INVENTOR
C. D. THURMOND
BY [signature]
ATTORNEY

June 3, 1958 C. D. THURMOND 2,837,448

METHOD OF FABRICATING SEMICONDUCTOR PN JUNCTIONS

Filed Oct. 26, 1953 2 Sheets-Sheet 2

INVENTOR
C. D. THURMOND
BY [signature]
ATTORNEY

United States Patent Office 2,837,448

Patented June 3, 1958

2,837,448

METHOD OF FABRICATING SEMICONDUCTOR PN JUNCTIONS

Carl D. Thurmond, Morristown, N. J., assignor to Bell Telephone Laboratories, Incorporated, New York, N. Y., a corporation of New York Application October 26, 1953, Serial No. 388,094

7 Claims. (Cl. 148—1.5)

This invention relates to the fabrication of semiconductive bodies for signal translating devices and more particularly to methods of producing PN junctions in germanium and silicon wafers.

Semiconductor bodies having PN junctions therein find application in a variety of signal translating devices, for example in rectifiers and photocells, such as disclosed in Patent 2,602,211, granted July 8, 1952, to J. H. Scaff and H. C. Theuerer, and in transistors such as disclosed in Patent 2,569,347, granted September 25, 1951, to W. Shockley. The junctions may be produced in a number of ways, one advantageous method involving alloyage of a significant impurity with a portion of a semiconductive body. Significant impurity as used in the specification and claims designates an impurity whose presence in a semiconductor determines the conductivity type of the semiconductor. In this method, generally, a donor impurity is placed in contact with a semiconductive body of P type (or an acceptor is placed in contact with a semiconductive body of N type) and the assembly is heated to a temperature at which the semiconductor and impurity alloy, the temperature of heating being such that only a portion of the body fuses. Upon cooling of the assembly, recrystallization of the molten mixture occurs and there is formed on the unfused portion of the body a layer of the semiconductor of the opposite conductivity type, whereby a PN junction is produced. An illustrative method of this type is disclosed in the application Serial No. 270,370, filed February 7, 1952, of G. L. Pearson.

It has been found that in fabricating PN junctions by fusion techniques, frequently strains are introduced in the semiconductor during the recrystallization, whereby the electrical and physical characteristics of the junction are affected deleteriously and cracks are produced in the body, rendering the product useless. These effects are encountered particularly in the production of large area junctions, say of the order of one tenth to one centimeter square or larger in area.

One general object of this invention is to facilitate the production of semiconductive bodies having a PN junction therein. More specific objects of this invention are to enable the production of germanium and silicon PN junctions of relatively large area, and to realize strain free junctions and such having advantageous electrical performance characteristics.

In general, in the fabrication of PN junctions in accordance with this invention, a coating or layer of a donor or acceptor is provided upon a body of P or N type semiconductive material respectively and the assembly is heated above the eutectic temperature of the semiconductor and impurity. The temperature of heating is such that only a portion of the body fuses and combines with the impurity.

In accordance with one feature of this invention, following the heating above described, the temperature is reduced to somewhat above the eutectic temperature of the semiconductor and impurity, and a molten mass of a metal having a melting point substantially lower than that of the impurity is introduced over the semiconductor-impurity mass. After this the assembly is cooled. During the cooling, in effect, a substantial portion of the molten semiconductor-impurity first floats on the molten metal and then solidifies. Between the metal and the unfused portion of the semiconductive body there is formed a semiconductor zone of conductivity type opposite that of the initial body and which forms a PN junction with the unfused portion. The junction is of uniform electrical and physical characteristics and large area junctions can be formed free of deleterious strains.

In one specific embodiment of this invention, a layer of wafer of aluminum is provided upon a wafer of N type silicon and the unit mounted in a crucible. The unit then is heated to about 900 to 950° C. and thereafter cooled slowly to about 700 to 750° C. With the unit held at this temperature, molten indium is flowed into the crucible. Thereafter the assembly is cooled. The product is a wafer having an N type silicon base portion, a P type silicon layer upon and forming a junction with the base portion, an indium rich layer over the P type layer and an aluminum rich layer upon the indium layer. The aluminum and indium rich layers may be removed as by etching, leaving a silicon body having a PN junction therein.

The invention and the above noted and other features thereof will be understood more clearly and fully from the following detailed description with reference to the accompanying drawing, in which.

Figure 1:
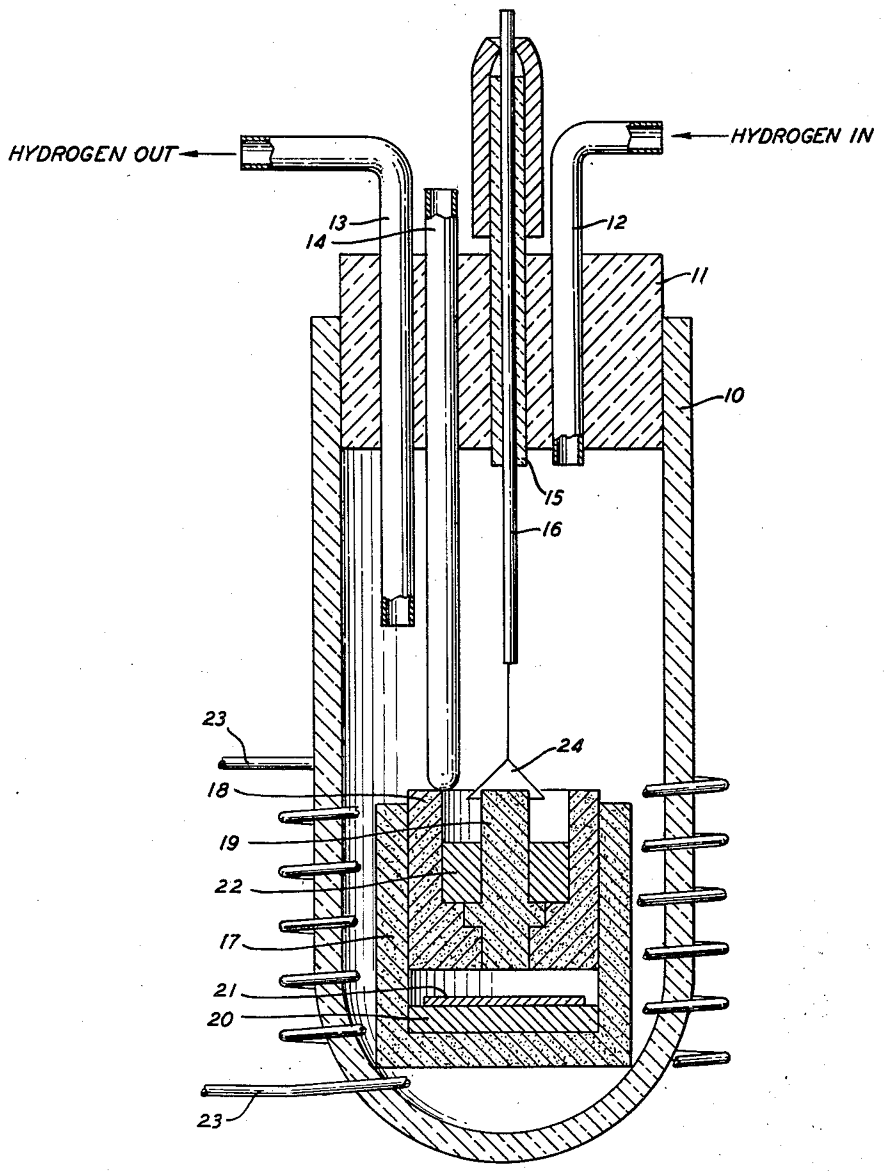
Fig. 1 illustrates diagrammatically apparatus which may be employed in the fabrication of semiconductive bodies in accordance with this invention.

Referring now to the drawing, the apparatus portrayed in Fig. 1 comprises a vessel 10 for example of porcelain having at its open end a stopper 11 provided with inlet and outlet ports 12 and 13, respectively, through which an inert gas, such as helium or hydrogen, may be introduced and circulated through the vessel. The stopper 11 has extending therethrough also a tube 14 for receiving a thermocouple, and a sleeve 15 through which a rod 16, the function of which will be described presently, extends.

Seated within the vessel 10 is a first crucible 17 having removably seated therein a second crucible 18. The crucible 18 has an aperture in its base in which a plug 19 is seated. The plug 19 is coupled to the rod 16 by a yoke 24 and may be withdrawn from aperture in the base of the crucible 18 by manipulation of the rod.

Disposed in the cavity between the two crucibles is a semiconductive wafer or disc 20 having on one face thereof a layer, coating or wafer 21 of significant impurity. Disposed within the crucible 18 is a mass 22 of a metal having a melting point low in comparison to that of the impurity material 21.

A heating coil 23 encompasses the vessel 10 and is positioned to concentrate the heat at the crucibles 17 and 18; the latter advantageously may be of graphite and heated by induction from the coil 23.

In general, in utilization of the apparatus depicted in Fig. 1 the disc or wafer 20 and the impurity 21 are heated to somewhat above the eutectic temperature of the semiconductor and impurity. This heating results in melting of the metal 22. At an appropriate point in the process as hereinafter described, the plug 19 is lifted by manipulation of the rod 16 to permit flow of the molten metal 22 through the aperture in the base of the crucible 18 and over the wafer impurity unit.

In one illustrative embodiment, the wafer 20 may be of N conductivity type silicon of about 3.5 ohm centimeter resistivity, approximately one centimeter on a side and 2 to 3 millimeters thick, and the impurity element 21 may be a wafer of pure aluminum about ¼ to ½ millimeter thick and of slightly smaller area than the wafer. The material 22 may be indium, about 3 grams in quantity. A continuous flow of hydrogen is maintained in the vessel 10 through the ports 12 and 13 and the crucible charges are heated by energizing the coil 23, say with 60 cycle current.

The silicon-aluminum assembly 20, 21 is heated to a temperature somewhat above the melting point of aluminum (660° C.) and the eutectic temperature (570° C.) of aluminum and silicon, for example, to about 900 to 950° C. and is maintained at this temperature for about one-half hour. Then the temperature is lowered slowly, at a rate of about one degree per minute, to about two hundred degrees below the initial temperature, i. e., to about 700° C. At this time, the plug 19 is raised, whereupon the molten indium flows over and submerges the unit 20, 21. The temperature is maintained for about 5 or 10 minutes. Thereafter, the coil 23 is disconnected from the power supply and the material within the crucible cools to room temperature.

Figure 2:
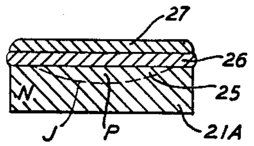
Fig. 2 is an elevational view showing the composition of a semiconductive body produced in accordance with this invention.

The product, as illustrated in Fig. 2, comprises a portion 21A of N conductivity type silicon, a layer 25 of P conductivity type silicon forming a junction J with the portion 21A, a zone 26 of aluminum, indium and silicon, rich in indium, and a layer 27 similar to zone 26 but rich in aluminum. The function of the several layers and zones will be appreciated from the following considerations.

Figure 3:
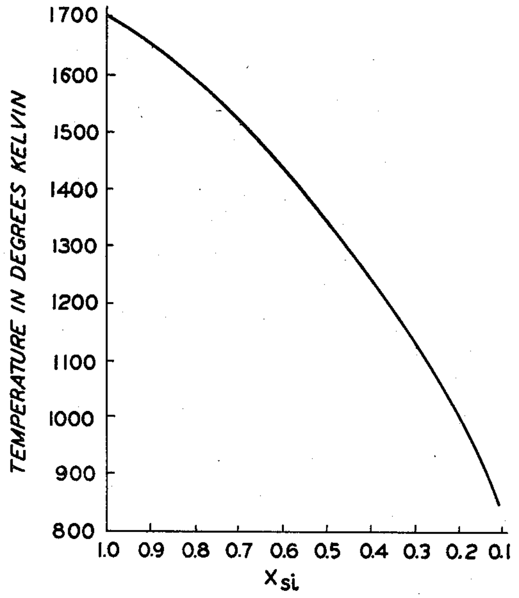
Fig. 3 is a temperature-solubility curve for silicon in aluminum.

Silicon is soluble in molten aluminum and is capable of forming a saturated solution therewith over a wide range of temperatures. The composition of the solution is dependent upon the temperature as indicated in Fig. 3 wherein the ordinates are temperature in degrees Kelvin and the abscissae are the atom fraction of silicon present in the solution. Analysis of material resulting from slow cooling of aluminum-silicon melts indicates that the average aluminum concentration is about 0.15 percent by weight so that the aluminum segregation co-efficient is about $2\times10^{-3}$. Thus, when, as in the specific case described hereinabove, the assembly after heating to 900 to 950° C. is cooled slowly to 700° C., in effect a layer of silicon heavily doped with aluminum, and hence of P type, is formed upon the silicon wafer. As the aluminum-silicon solution is saturated, it will be appreciated that only a portion of the wafer enters into the solution. Thus, viewed in one way, a P type layer grows upon the N type wafer, considered as a seed, when the temperature is reduced.

Indium and aluminum are but slightly miscible in the molten phase. Indium, of course, has a lower melting point (155° C.) than aluminum and, further, is relatively soft. When, in the process, the indium is added to the aluminum phase as above described, the aluminum phase floats to the top. Upon solidification of the composite, the indium rich phase separates the aluminum rich phase from the silicon body.

PN junctions produced in the manner described have excellent rectification characteristics and further are free from deleterious strains and cracks. Use of either aluminum or indium alone does not result in comparable structures. Specifically, it has been found that when aluminum alone is used, strains and cracks are produced, probably because the contraction of the aluminum-silicon eutectic upon cooling is much greater than that of silicon. Also, it has been found that when indium alone is used, indium, like aluminum, being an acceptor, the junctions produced exhibited only poor rectification characteristics.

Figure 5:
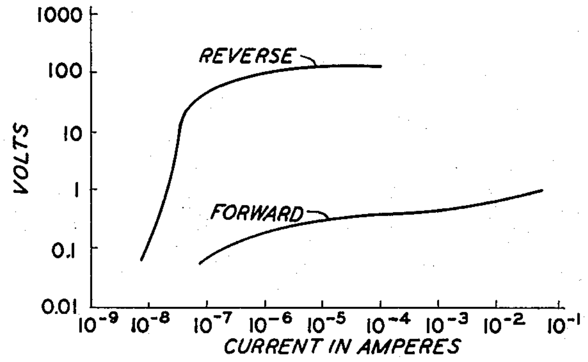
Fig. 5 is a graph representing performance characteristics of a typical rectifier of the construction portrayed in Fig. 3.
Figure 4:
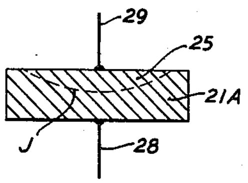
Fig. 4 depicts a rectifier utilizing a PN junction produced in accordance with this invention.

Following the fabrication of a body such as depicted in Fig. 2, the layers 26 and 27 are removed, as, for example, by etching in hydrochloric acid. Connections 28 and 29 are established to the N and P zones 21A and 25, respectively, as by platings of copper or gold. The rectification properties of a typical junction diode constructed as above described are represented in Fig. 5, the two curves, as designated, showing the reverse and forward characteristics.

The invention may be utilized also with materials other than those noted in the specific case above described, to realize the advantages of particular efficacy of certain impurities in effecting inversion of conductivity type of the semiconductor, without production of degrading strains in the product. For example, antimony, a donor, is particularly effective in converting P type germanium to N type. However, when a solution of germanium in antimony solidifies, as in growing an N type layer upon a P type base, serious strains are developed and cracks are produced in the product. These defects may be avoided in accordance with this invention, by following the steps above described. Specifically, a wafer of germanium with a coating or wafer of antimony thereon is heated to about 750° C., maintained at this temperature for about one-half hour, and then cooled slowly, at a rate of about one degree per minute, to approximately 600° C. At this time, molten lead is introduced into the crucible in the manner described hereinabove and thereafter the combination is allowed to cool to room temperature. The product is of the form depicted in Fig. 2, a body of P type germanium, like the zone 21A, and a zone of N type germanium, like zone 25, forming a junction with the P type body. Over the N zone is a region composed of germanium, antimony and lead, and upon this a layer of lead with antimony particles therein.

Further, other materials and combinations may be employed. For example, in the silicon-aluminum example above described in detail, any one of cadmium, thallium, lead and bismuth may be used in place of the indium. In each case, a light aluminum rich phase is formed and floats to the top of the melt leaving a relatively soft metal phase in contact with the P type zone formed. Tin may also be utilized in place of indium. In this case, upon introduction of the tin into the crucible, an aluminum-tin-silicon phase is formed. As the temperature is lowered, silicon will first deposit, then silicon and aluminum together and finally essentially pure tin.

In like manner, a junction may be produced beginning with N type germanium and employing aluminum as the acceptor, and any of the metals above mentioned as the introduced material. Further, the formation of junctions in the manner above described and involving antimony and lead may be effected in silicon as well as in germanium.

In general, the material introduced into the molten semiconductor-impurity mass should have a low melting point and have mechanical softness. Further, it should be such that the semiconductor, germanium or silicon, and the impurity, for example aluminum or antimony, are only slightly soluble in the molten additive at its melting point.

Also, an alloy of the semiconductor and the significant impurity may be used in place of the impurity alone for the layer or wafer 21. For example, in place of the aluminum in the specific embodiment hereinabove described, an alloy of aluminum and silicon may be used, the alloy having a composition corresponding to that of a selected temperature on the solubility curve of Fig. 3. The silicon body with the silicon-aluminum alloy thereon is heated slowly to this temperature. As the aluminum is substantially saturated with silicon, very little of the silicon body will dissolve. The temperature then is increased whereby a portion of the body enters into the solution. Following this, as in the other embodiments described hereinabove, the temperature is lowered, the additive metal, e. g. indium, is introduced into the crucible and the mass cooled. The resultant structure is as depicted in Fig. 2. A particular advantage of the use of a semiconductor-impurity alloy in this manner is that the amount of the said body which dissolves in the impurity may be made small, greater uniformity of solution of the face of the initial body obtains, and greater planarity of the PN junction produced is realized.

What is claimed is:

1. The method of producing a semiconductor PN junction which comprises placing a significant impurity determinative of one conductivity type upon crystalline semiconductive material of opposite conductivity type, heating the assembly to a temperature above the eutectic temperature of said impurity and material and below the melting point of said material, slowly cooling the assembly to a temperature between the initial temperature and said eutectic temperature for forming a layer of the one conductivity type on the surface of the semiconductive body in contact with the molten layer, flooding the resulting combination with a molten metal which is appreciably softer than and which has a melting point substantially below that of said impurity and further characterized in that said semi-conductive material and said impurity are only slightly soluble in said molten metal at its melting point, and cooling the product to room temperature.

2. The method of claim 1 in which the said semiconductive material is in the shape of a wafer and in which the said method is carried out in a crucible.

3. The method of claim 1 in which the said semiconductive material is in the form of a wafer, is a material selected from the group consisting of silicon and germanium and in which the said method is carried out with the wafer on a support.

4. The method of claim 1 in which the said semiconductive material is of n-type conductivity, is a material selected from the group consisting of silicon and germanium and in which the said significant impurity is aluminum.

5. The method of claim 1 in which the said semiconductive material is of p-type conductivity, is a material selected from the group consisting of silicon and germanium and in which the said significant impurity is antimony.

6. The method of claim 4 in which the said material is silicon, in which the assembly is first heated to about 900° C., in which the assembly is then cooled to about 700° C., and in which the metal is indium.

7. The method of claim 5 in which the said material is germanium, in which the assembly is first heated to about 750° C., in which the assembly is then cooled to about 600° C., and in which the metal is lead.

References Cited in the file of this patent

UNITED STATES PATENTS

| | | |
|---|---|---|
| 2,402,662 | Ohl | June 25, 1946 |
| 2,561,411 | Pfann | July 24, 1951 |
| 2,569,347 | Shockley | Sept. 25, 1951 |
| 2,603,693 | Kircher | July 15, 1952 |
| 2,644,852 | Dunlap | July 7, 1953 |
| 2,725,316 | Fuller | Nov. 29, 1955 |

OTHER REFERENCES

Proceedings of the Institute of Radio Engineers, vol. 40, No. 11, November 1952, pages 1341–1342. Article by Armstrong.

Electronics, October 1953, pages 130–134.